United States Patent
Busse et al.

(10) Patent No.: US 9,351,420 B2
(45) Date of Patent: May 24, 2016

(54) SYSTEMS AND METHODS FOR MANUFACTURING INDUSTRIAL AUTOMATION DRIVES

(71) Applicant: Rockwell Automation Technologies, Inc., Mayfield Heights, OH (US)

(72) Inventors: Doyle F. Busse, Jackson, WI (US); Kevin G. Stachowiak, Germantown, WI (US); Kevin L. Baumann, Cedarburg, WI (US); Raymond G. Sladky, Grafton, WI (US); Gary R. Krenke, Germantown, WI (US); John C. Boetcher, Richfield, WI (US); Brian R. Krueger, Brown Deer, WI (US); Robert M. Michalski, West Bend, WI (US); Paul J. Grosskreuz, West Bend, WI (US); Joseph William Budill, Grayslake, IL (US); Brian C. Frank, Cedarburg, WI (US); Martha A. Maxwell, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 322 days.

(21) Appl. No.: 13/664,269

(22) Filed: Oct. 30, 2012

(65) Prior Publication Data
US 2013/0120946 A1 May 16, 2013

Related U.S. Application Data

(60) Provisional application No. 61/559,655, filed on Nov. 14, 2011.

(51) Int. Cl.
*H05K 7/00* (2006.01)
*H05K 7/14* (2006.01)

(52) U.S. Cl.
CPC ............ *H05K 7/1432* (2013.01); *H05K 7/1471* (2013.01); *Y10T 29/49947* (2015.01)

(58) Field of Classification Search
CPC .......................... H05K 7/1471; H05K 7/1432
USPC ........................ 361/753, 724, 727; 312/223.2
See application file for complete search history.

(56) References Cited

U.S. PATENT DOCUMENTS

| | | | | |
|---|---|---|---|---|
| 5,863,141 A * | 1/1999 | Hong et al. | ................... | 400/692 |
| 6,040,981 A * | 3/2000 | Schmitt et al. | ................ | 361/695 |
| 6,052,278 A * | 4/2000 | Tanzer et al. | ............ | 361/679.33 |
| 6,088,222 A * | 7/2000 | Schmitt et al. | ........... | 361/679.33 |
| 6,295,701 B1 * | 10/2001 | Bessho | ................ | H05K 5/0013 24/297 |
| 6,320,743 B1 * | 11/2001 | Jin et al. | ................... | 361/679.08 |
| 6,350,063 B1 * | 2/2002 | Gilliland et al. | ................ | 385/88 |
| 6,785,146 B2 * | 8/2004 | Koike | .................. | H05K 7/1417 361/740 |

(Continued)

*Primary Examiner* — Adrian S Wilson
*Assistant Examiner* — Abhishek Rathod
(74) *Attorney, Agent, or Firm* — Fletcher Yoder, P.C.

(57) ABSTRACT

A system for manufacturing an industrial automation drive includes a carrier frame configured to hold one or more semiconductor devices for use in the industrial automation drive. The carrier frame includes a set of fasteners disposed around an internal wall of the carrier frame such that each fastener of the set of fasteners includes an angled edge and a horizontal edge. Each fastener of the set of fasteners is configured to toollessly couple a power circuit board having the semiconductor devices to the carrier frame by bending from a first position when the power circuit board is pushed against the angled edge and returning to the first position when the power circuit board is pushed past the horizontal edge.

7 Claims, 8 Drawing Sheets

(56) References Cited

U.S. PATENT DOCUMENTS

| | | | |
|---|---|---|---|
| 6,893,293 B2* | 5/2005 | Ice et al. | 439/607.2 |
| 7,057,901 B2* | 6/2006 | Roscoe et al. | 361/796 |
| 7,090,527 B2* | 8/2006 | Hanley et al. | 439/372 |
| 7,300,215 B2* | 11/2007 | Hsiao et al. | 385/92 |
| 7,388,749 B1* | 6/2008 | Feroli et al. | 361/679.48 |
| 7,566,246 B2* | 7/2009 | Moore et al. | 439/607.01 |
| 2003/0185525 A1* | 10/2003 | Lacy et al. | 385/92 |
| 2004/0057195 A1* | 3/2004 | Hsieh | 361/680 |
| 2004/0067681 A1* | 4/2004 | Wu | 439/497 |
| 2004/0246669 A1* | 12/2004 | Minaguchi et al. | 361/683 |
| 2005/0070162 A1* | 3/2005 | Espenshade et al. | 439/620 |
| 2005/0081224 A1* | 4/2005 | Hsu | G06F 1/181 720/657 |
| 2005/0280990 A1* | 12/2005 | Goodenough et al. | 361/695 |
| 2006/0120057 A1* | 6/2006 | Apfelbacher et al. | 361/752 |
| 2006/0279912 A1* | 12/2006 | Shi et al. | 361/680 |
| 2007/0167077 A1* | 7/2007 | Mizue | 439/607 |
| 2009/0027849 A1* | 1/2009 | Tanaka | 361/686 |
| 2011/0141774 A1* | 6/2011 | Kane et al. | 363/37 |
| 2012/0262851 A1* | 10/2012 | Ke et al. | 361/679.01 |

* cited by examiner

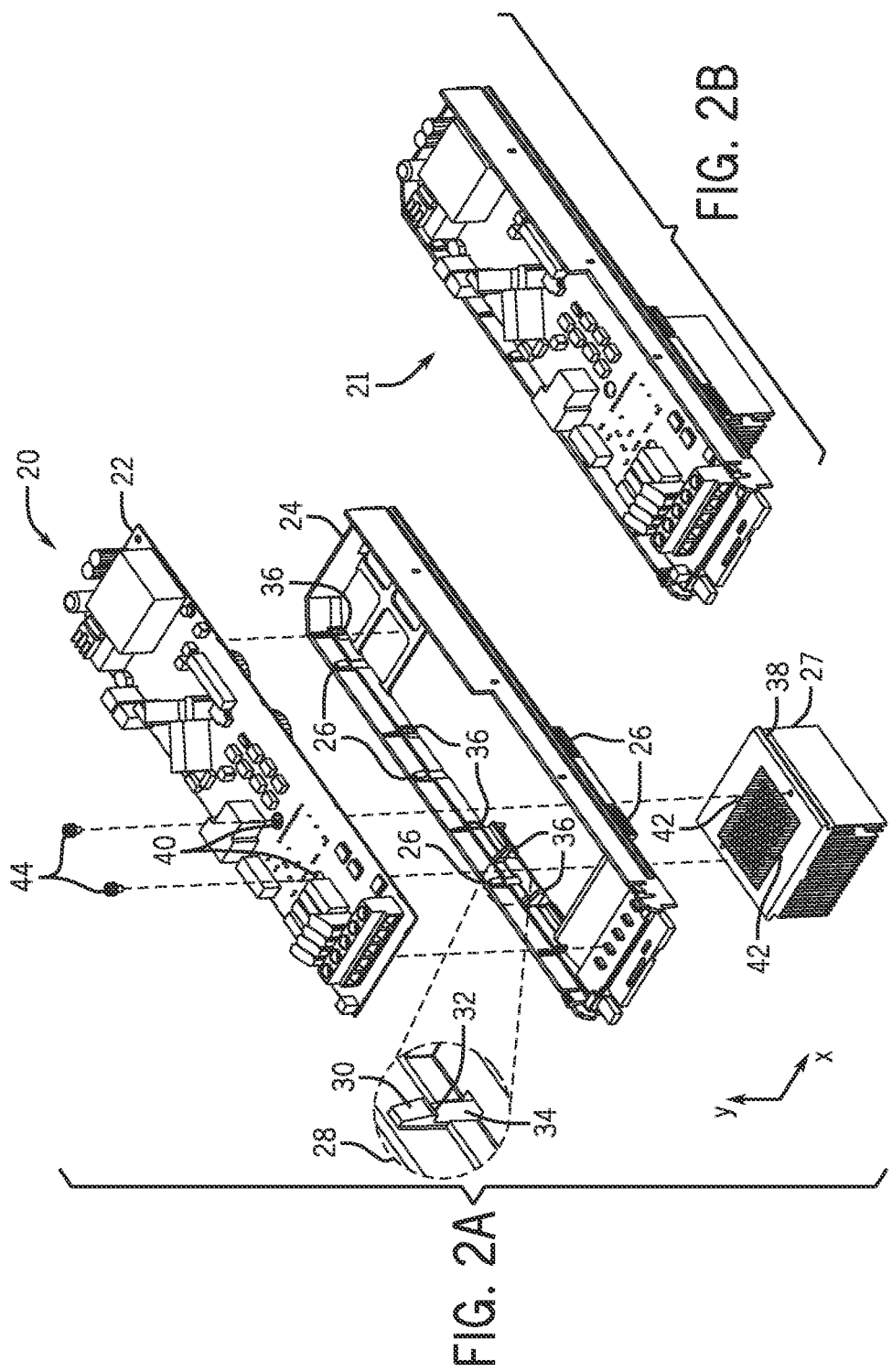

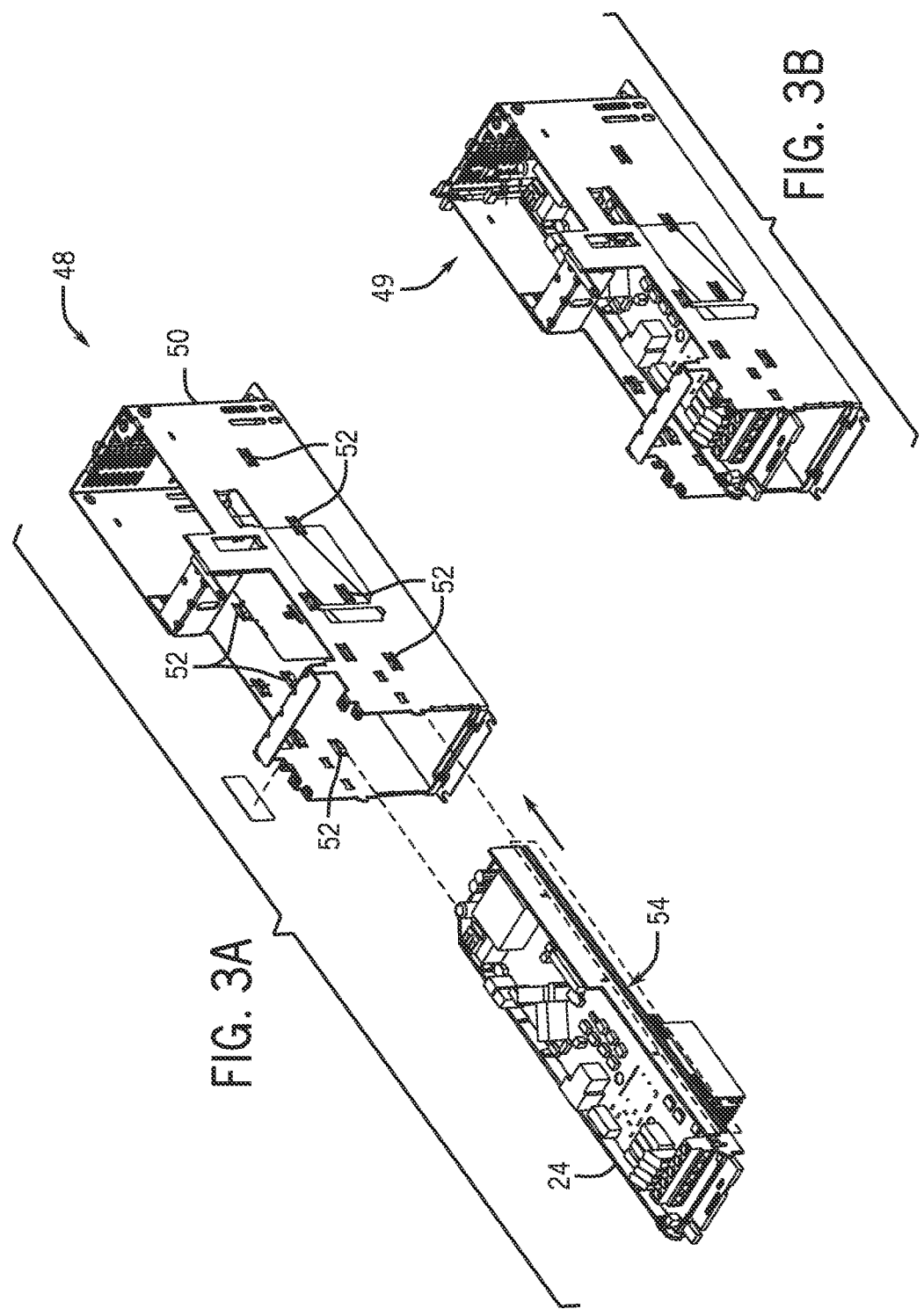

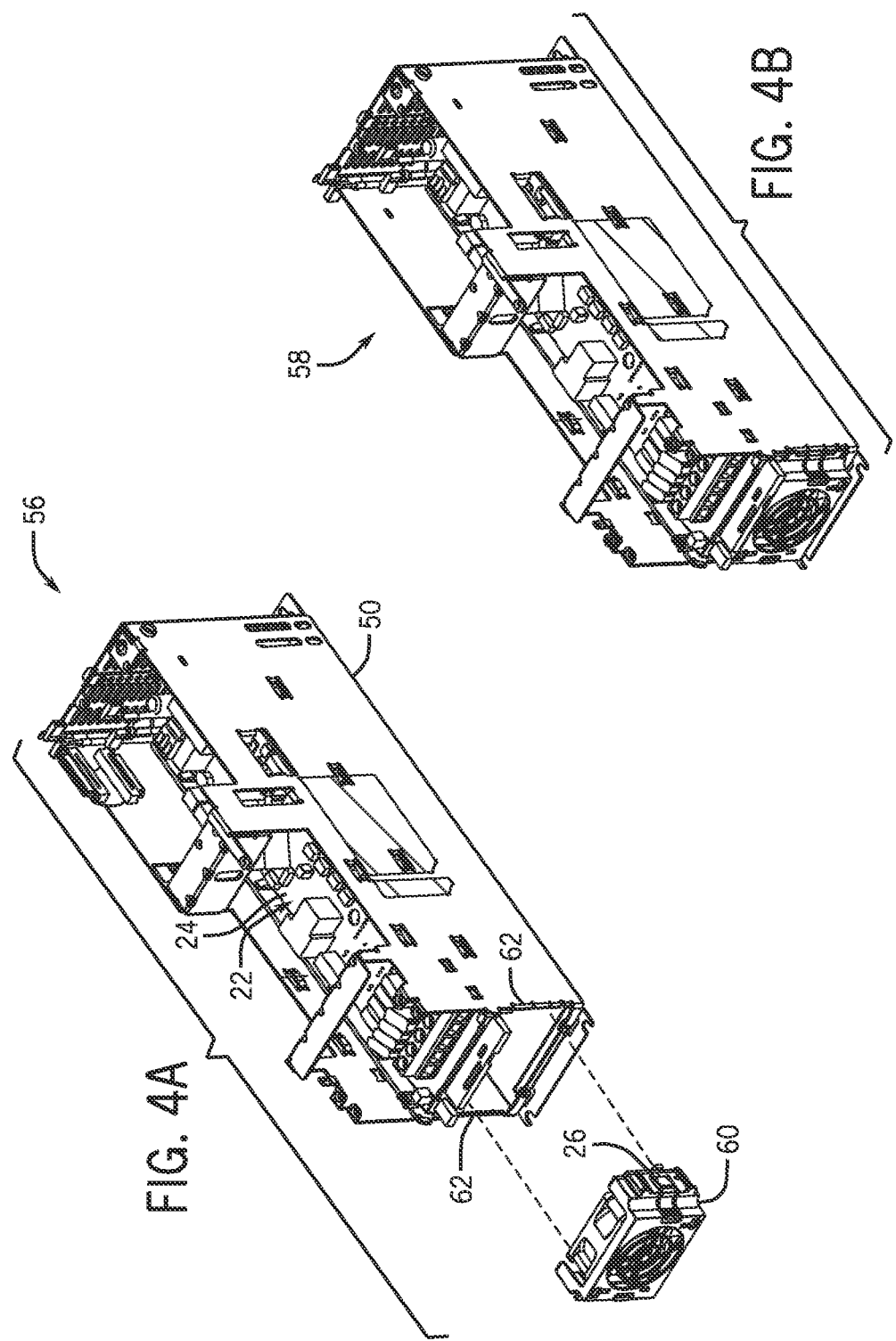

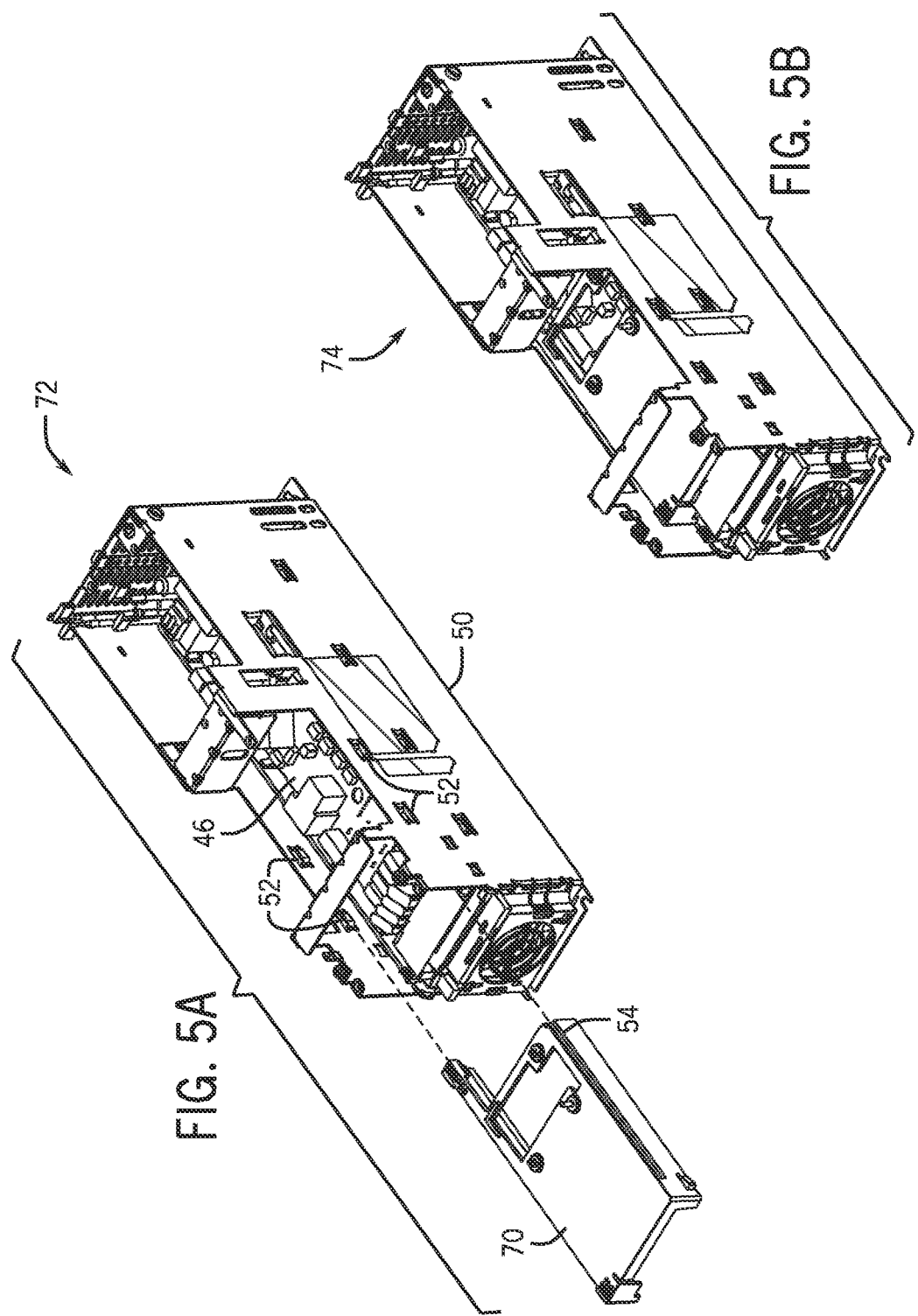

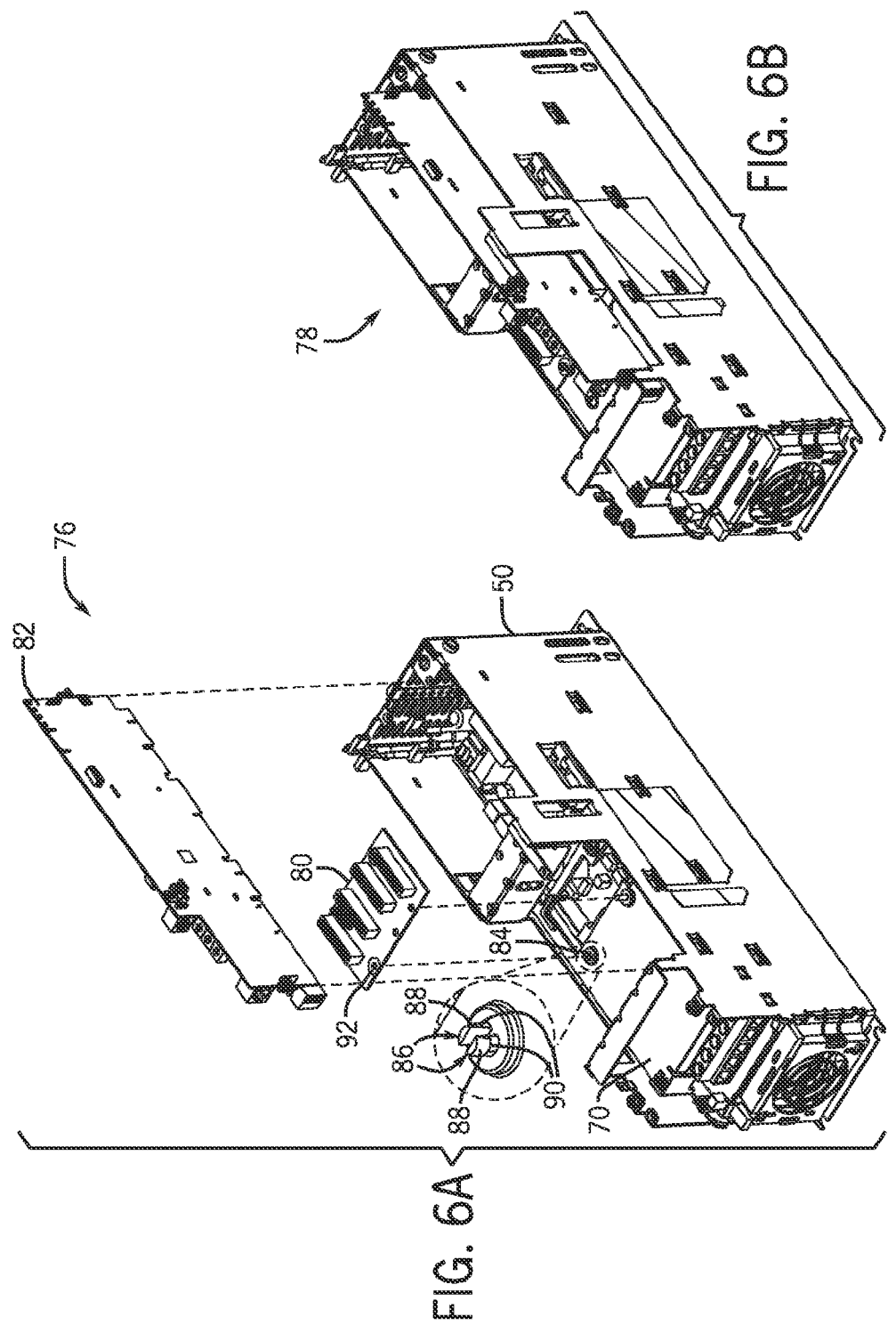

SYSTEMS AND METHODS FOR MANUFACTURING INDUSTRIAL AUTOMATION DRIVES

CROSS-REFERENCE TO RELATED APPLICATIONS

This application claims the benefit of U.S. Provisional Application No. 61/559,655, filed Nov. 14, 2011.

BACKGROUND

The present disclosure relates generally to the field of industrial automation drives. More particularly, the disclosure relates to systems and techniques for manufacturing industrial automation drives.

An industrial automation drive is a type of adjustable-speed drive used in electro-mechanical drive systems to control the speed and torque of a motor by varying frequency and voltage input to the motor. Generally, an industrial automation drive, such as an AC drive system, includes a power converter (e.g., rectifier) that converts AC power into DC power and an inverter that converts the DC power into a controllable AC power. The inverter consists of semiconductor devices, such as insulated gate bipolar transistors (IGBTs), that may be used to control the amount of the AC power being output by the inverter. The semiconductor devices operate based on gate signals provided from an electronic circuit board (e.g., power circuit board), which may be operated by a controller that may be part of another electronic circuit board (e.g., control circuit board).

Each of the above-described components of the AC drive system, along with various other components, are typically manufactured together such that the entire AC drive system may be placed within a single enclosure. In some cases, the enclosure may be placed in a room along with other electrical systems and devices such that the AC drive system may be connected to its appropriate electrical device (e.g., motors). Given the electrical characteristics and the complex connections involved with each component of the AC drive system, manufacturing the AC drive system is an intricate and time-intensive process. Accordingly, improved systems and techniques for manufacturing drive systems may increase the efficiency associated with manufacturing drive systems.

BRIEF DESCRIPTION

The present disclosure generally relates to systems and techniques for manufacturing industrial automation drive systems such as alternating current (AC) or direct current (DC) drives. Industrial automation drive systems typically include a number of power semiconductor devices that may be used to convert and/or invert input voltage and a number of control circuits that may be used to control the power semiconductor devices. Generally, the power semiconductor devices and the control circuits may be coupled to each other using low voltage wiring, fiber optics, or the like. However, the power semiconductor devices and the control circuits may be shielded from each other to prevent the relatively high currents conducting through the power semiconductor devices from interfering (e.g., via electric or magnetic fields) with the control circuits. As such, great care should be taken when manufacturing an industrial automation drive system to ensure that the industrial automation drive system operates properly.

In certain embodiments, the industrial automation drive system's manufacturing process may include using clip-like fasteners to secure various components of the industrial automation drive system together. For instance, instead of using a number of screws to secure a component in place, a component, such as a printed circuit board (PCB) may be secured onto a carrier frame, which may be mounted in a chassis of the industrial automation drive, using two sets of flexible protrusions (e.g., clip-like fasteners) extending from a wall of the carrier frame. That is, the component may fit into the carrier frame by pressing the component against a first set of protrusions, which may be lipped protrusions that may bend backwards until the component is pushed past some point on each lipped protrusion such that the component fits under a lip portion of the lipped protrusion. The second set of protrusions may be positioned underneath the first set of protrusions such that the component may rest on the second set of protrusions and fit securely between the two sets of protrusions.

After securing various components onto the carrier frame, the industrial automation drive system's manufacturing process may include sliding the carrier frame into a main chassis of the industrial automation drive. As such, the main chassis may include dimples extending from a wall of the main chassis into the inner portion of the chassis. The carrier frame may include two channels along two of its sides such that the channels may slide into the dimples extending from the wall of the chassis.

Additionally, after all of the components of the drive system are placed within the main chassis, an upper chassis may be secured onto the main chassis using a clip-like fastener as described above. The upper chassis may be used to enclose the top portion of the main chassis and may be used to provide access to the components disposed on the top of the main chassis. In one embodiment, the upper chassis may be secured to the main chassis via annular protrusions extending outward from the wall of the main chassis. The annular protrusions may secure the upper chassis to the main chassis by fitting annular holes of the upper chassis into the annular protrusions of the main chassis. As a result, the upper chassis may rotate along an axis inline with the two annular protrusions such that the upper chassis may open to provide access to the inside of the metal chassis.

DRAWINGS

These and other features, aspects, and advantages of the present disclosure will become better understood when the following detailed description is read with reference to the accompanying drawings in which like characters represent like parts throughout the drawings, wherein:

FIG. 2A is an exploded view of a circuit board and a carrier frame in the industrial automation drive of FIG. 1, and FIG. 2B is a perspective view of an the circuit board and carrier frame, in accordance with an embodiment;

FIG. 3A is an exploded view of the circuit board, the carrier frame, and a chassis for the industrial automation drive of FIG. 1, and FIG. 3B is a perspective view of the circuit board, the carrier frame, and the chassis, in accordance with an embodiment;

FIG. 4A is an exploded view of a fan unit to be coupled to the chassis of FIG. 3, and FIG. 4B is a perspective view of the fan unit coupled to the chassis, in accordance with an embodiment;

FIG. 5A is an exploded view of a voltage barrier to be coupled to the chassis of FIG. 3, and FIG. 5B is a perspective view of the voltage barrier coupled to the chassis, in accordance with an embodiment;

Figure 7A:
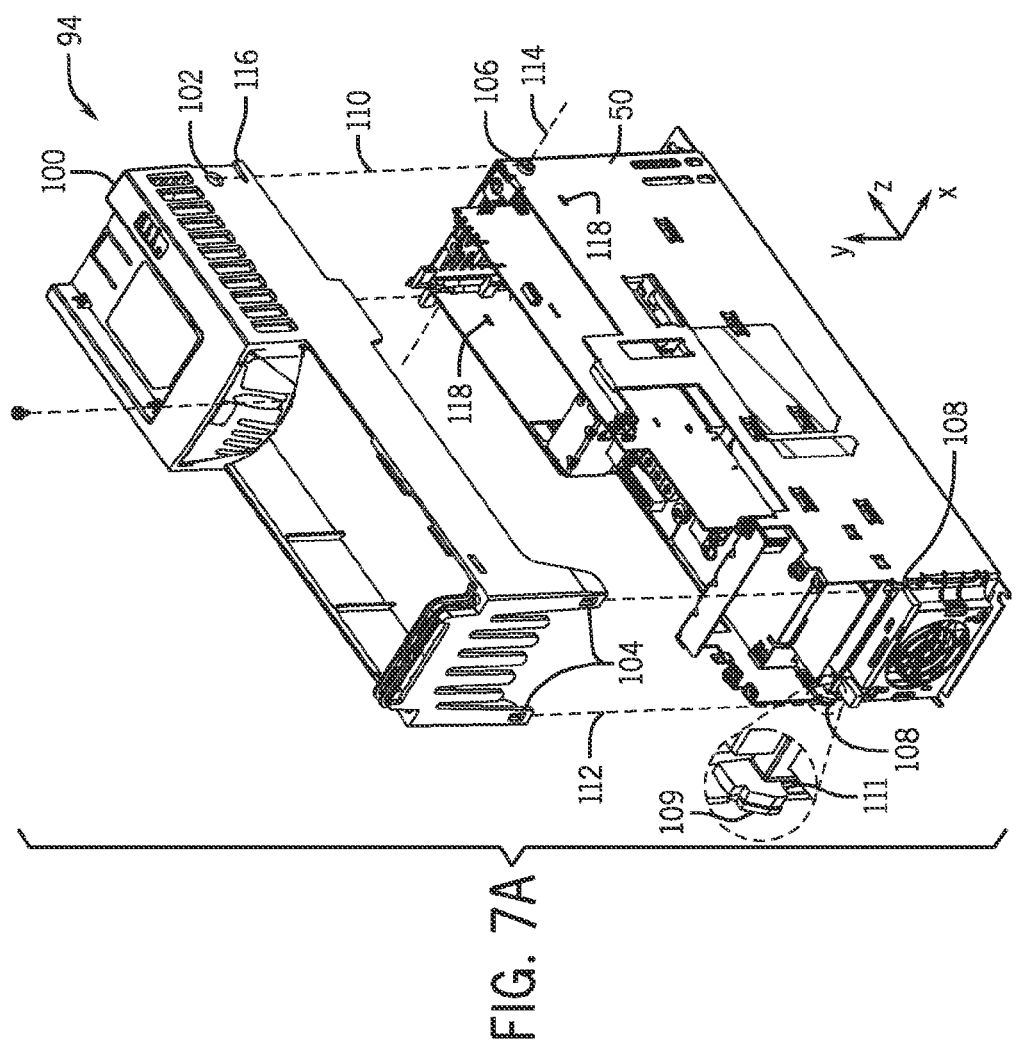
Figure 7C:
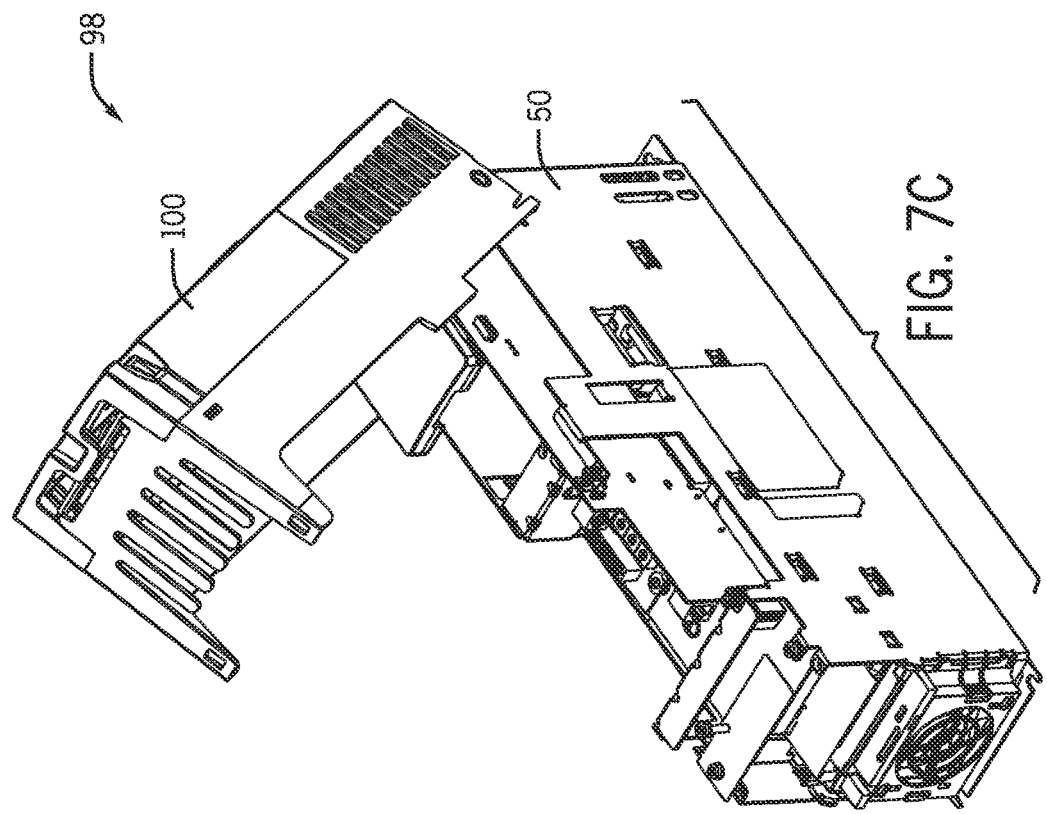
Figure 7B:
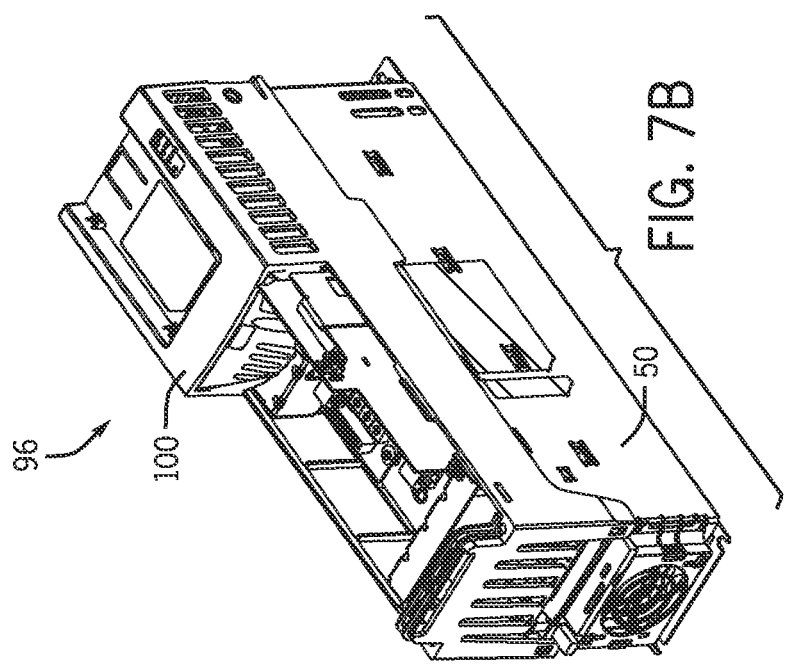

FIG. 6A is an exploded view of additional circuit boards to be coupled to the chassis of FIG. 3, and FIG. 6B is a perspective view of the additional circuit boards coupled to the chassis, in accordance with an embodiment; and FIG. 7A is an exploded view of an upper chassis to be coupled to the chassis of FIG. 3, and FIGS. 7B and 7C are perspective views of the upper chassis coupled to the chassis, in accordance with an embodiment.

DETAILED DESCRIPTION

Systems and methods of the present disclosure are related to manufacturing an industrial automation drive such as an alternating current (AC) drive that may be used to drive an AC motor. In certain embodiments, various electronic components such as printed circuit boards (PCBs), heatsinks, voltage barrier plates, and the like may be coupled to a frame that may be placed within a chassis of the industrial automation drive or coupled to the chassis of the industrial automation drive using fasteners built into the frame or chassis. That is, the fasteners may be activated tool-lessly to securely hold the electronic components within the chassis. Unlike traditional screws, the fasteners may be actuated without employing tools. In one embodiment, the fasteners may be bendable such that each fastener may bend backwards from an original position while a component is being pushed into the fastener until the component is securely placed within the grasp of the fastener. At the instant that the component is securely placed within the grasp of the fasteners, the fasteners may snap back to their original positions. Once each component is securely fastened to a frame using the fasteners, the frame may slide into a chassis using channels disposed on two sides of the frame. The chassis may then be covered with an upper chassis that may be secured with similar clip-like fasteners, as described above. The use of the clip-like fasteners and sliding mechanisms may increase the speed and efficiency of the industrial automation drive's manufacturing process since coupling components with clip-like fasteners does not involve the use of tools. Additional details regarding the systems and techniques for manufacturing an industrial automation drive are described below with reference to FIGS. 1-7.

Figure 1:
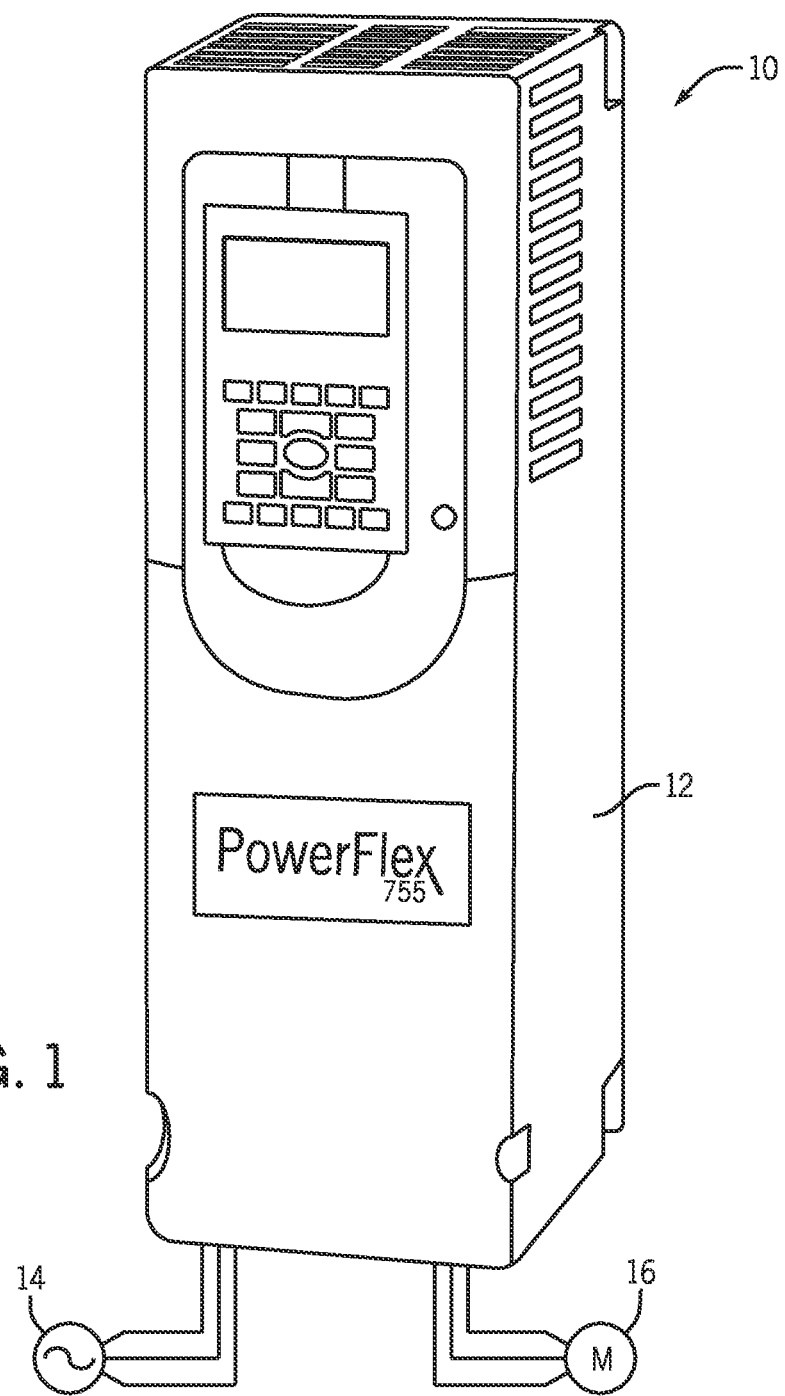
FIG. 1 is a perspective view of an industrial automation drive, in accordance with an embodiment of the present invention.

Referring now to the figures, FIG. 1 is a perspective view of an industrial automation drive 10. In one embodiment, the industrial automation drive 10 may be an alternating current (AC) drive (e.g., PowerFlex® drive manufactured by Rockwell Automation®). The industrial automation drive 10 may include a housing 12 that stores or couples with various electrical components forming the industrial automation drive 10 in accordance with present techniques.

The industrial automation drive 10 may be generally adapted to receive three-phase AC power from a power supply 14 and to convert fixed frequency input AC power from the power supply 14 to controlled frequency output power to be applied to a motor 16. The power supply 14 may include a generator or an external power grid. The industrial automation drive 10 may include a variety of components or devices used in the operation and control of a load (e.g., the motor 16). As will be described further below, the variety of components or devices disposed within the industrial automation drive 10 may be placed strategically to ensure that the industrial automation drive 10 operates efficiently and can be assembled efficiently. As such, certain components may be coupled relatively close to each other while other components may be insulated from each other. Given the number of components that make up the industrial automation drive 10 and the complex connections involved between the components of industrial automation drive 10, great care should be taken when manufacturing the industrial automation drive 10.

Keeping the foregoing in mind, FIG. 2 depicts an embodiment of a power layer in the industrial automation drive 10. Specifically, FIG. 2 illustrates an exploded view 20 of the power layer and an assembled view 21 of the power layer. The power layer may include a power circuit board 22, a carrier frame 24, and a heat sink 27. The power circuit board 22 may be a printed circuit board (PCB) with various electrical components such as power semiconductors devices (e.g., insulated gate bipolar transistors). The power circuit board 22 may also include circuitry that may be used to control the operation of the power semiconductor devices. For instance, the power circuit board 22 may send gate signals to the power semiconductor devices (not shown), which may be positioned underneath the power circuit board 22.

In certain embodiments, the power circuit board 22 may be secured onto the carrier board 24 using clip-like fasteners 26, which are disposed along an inner wall of the carrier frame 24. The carrier frame 24 may be a constructed using a malleable material such as plastic and may include shaped protrusions (i.e., clip-like fasteners 26) extending from the inner wall of the carrier frame 24. As shown in magnified view 28, the clip-like fastener 26 may include an angled edge 30, a horizontal edge 32, and a vertical edge 34. In certain embodiments, the angled edge 30 may be spherical. In any case, the clip-like fasteners 26 may be used to secure the power circuit board 22 to the carrier frame 24. For instance, the power circuit board 22 may initially be pushed against the angled edge 30 of the clip-like fastener 26. Since the carrier frame 24 may be malleable, the clip-like fasteners 26 may be bent to a certain degree without breaking. As such, the clip-like fasteners 26 may be constructed such that the angled edge 30 may bend backwards (i.e., in an x-direction away from a center line long the length of the carrier frame 24) until the power circuit board 22 pushes past the horizontal edge 32 and rests against extensions 36. Although the clip-like fasteners 26 have been described as having an angled edge 30, a horizontal edge 32, and a vertical edge 34, it should be noted that the clip-like fastener 26 may be constructed in a variety of ways such that the power circuit board 22 may snap or clip into the clip-like fastener 24.

The extensions 36 may also be protrusions extending from the inner wall of the carrier frame 24 and disposed below the horizontal edges 32 of the clip-like fasteners 26. The vertical distance (i.e., along the y-axis) between the horizontal edge 32 and the extensions 36 may be substantially similar to the thickness of the power circuit board 22. As such, the power circuit board 22 may fit tightly between the clip-like fasteners 26 and the extensions 36 such that the power circuit board 22 may be securely coupled to the carrier frame 24 without the use of separate fasteners (e.g., screws) or tools.

In certain embodiments, additional clip-like fasteners 26 disposed underneath the carrier frame may be used to couple the heat sink 27 to the carrier frame 24. As such, the heat sink 27 may include a coupling feature (e.g., channel 38) on two sides of the heat sink 27 that may be coupled to the carrier frame 24 via the clip-like fasteners 26. In one embodiment, the channel 38 may include a hollow area that may fit the angled edge 30 of the clip-like fastener 26. Once the heat sink 27 is coupled to the carrier frame 24 via the clip-like fasteners 26, the heat sink 27 may be evenly pressed against the surface of the power semiconductor device (not shown) such that current may conduct evenly across the surface of the power semiconductor device. Further, by using the clip-like fasteners 26 to secure the heat sink 27 to the carrier frame 24, the heat sink 27 may be positioned such that holes 40 on the power circuit board 22 may be aligned with threads 42 on the heat sink 27 such that screws 44 may be used to couple the heat sink 27 to the power semiconductor device(s) of the power circuit board 22. The screws 44 may then be torqued to a particular torque value to ensure that the power semiconductor device evenly conducts across its surface and onto the heat sink 27.

After the power circuit board 22 is coupled to the carrier frame 24, the assembled carrier frame 24 may be stored as a replacement part for the industrial automation drive 10 or placed within a chassis of the industrial automation drive 10, as shown in FIG. 3. By using the clip-like fasteners 26, the power circuit board 22 and the heat sink 27 may be coupled to the carrier frame 24 without the use of tools. As a result, the carrier frame 24 may be assembled more efficiently (e.g., in less time) than traditional assemblies because an assembler turns fewer screws. Further, pushing the power circuit board 22 into the carrier frame 24 until the clip-like fasteners 26 snap the power circuit board 22 into place is a relatively efficient process as compared to screwing various screws at various locations along the power circuit board 22 and the carrier frame 24. Moreover, since screws are typically metal, additional steps may be involved in ensuring that the screws used to couple the power circuit board 22 to the carrier frame 24 are electrically isolated from the components disposed on the power circuit board 22. In certain embodiments, the power circuit board 22 may include just one grounding screw to provide the electrical components on the power circuit board 22 a ground reference. Therefore, by reducing the number of screws used to couple various components to the carrier frame 24, the time and material (e.g., insulators) associated with manufacturing the industrial automation drive 10 may be reduced significantly.

Additionally, since the clip-like fasteners 26 are positioned in the same relative position for each different carrier frame 24, the positions of the power circuit board 22 and the heat sink 27 may be relatively the same with respect to each different carrier frame 24. As such, each carrier frame 24 may be manufactured in a consistent manner and the probability of incorrectly manufacturing the carrier frame 24 may be reduced significantly.

After the power circuit board 22 and the heat sink 27 have been coupled to the carrier frame 24, the carrier frame 24 may be inserted or slidably engaged into a chassis 50 of the industrial automation drive 10, as shown by exploded view 48 of the carrier frame 24 and the chassis 50 and assembled view 49 of the carrier frame 24 and the chassis 50 in FIG. 3. The chassis 50 may include a metal framework that supports the components of the industrial automation drive 10. In one embodiment, the chassis 50 may include coupling features such as dimples 52 defined by pressed or cut material from the walls of the chassis 50 into the internal space of the chassis 50. The dimples 52 may cooperate with features of the carrier frame 24 to enable the carrier frame 24 to slide into the inside of the chassis 50. For example, the carrier frame 24 may include a corresponding coupling feature such as a channel 54 or a runner along two sides (i.e., lengthwise) of the carrier frame 24 such that the channel 54 may slide into the dimples 52 of the chassis 50. Once the carrier frame 24 slides into the dimples 52, the dimples 52 may support the weight of the carrier frame 24 inside the chassis 50. In other embodiments, grooves or channels may be formed within the chassis 50 (instead of the dimples 52) and corresponding extensions (instead of the channel 54) from the carrier frame 24 may couple with the grooves.

Similar to how using the clip-like fastener 26 may increase the efficiency of the manufacturing process associated with the industrial automation drive 10, by using the dimples 52 and the channel 54 to hold the carrier frame 24 within the chassis 50, the manufacturing process associated with the industrial automation drive 10 may become even more efficient. For example, the carrier frame 24 may be assembled more efficiently (e.g., in less time) because an assembler simply slides the carrier frame 24 into the chassis 50, as opposed to securing the carrier frame 24 to the chassis 50 with screws. Further, sliding the power carrier frame 24 into the chassis 50 is an efficient process as compared to screwing various screws at various locations along the chassis 50. Moreover, since screws are typically metal, additional steps may be involved in ensuring that the screws used to couple the carrier frame 24 to the chassis 50 are electrically isolated from the components disposed on the carrier frame 24. Therefore, by reducing the number of screws used to secure the carrier frame 24 in the chassis 50, the time associated with manufacturing the industrial automation drive 10 may be reduced significantly.

In a similar fashion as to how the power circuit board 22 may be coupled to the carrier frame 24, FIG. 4 illustrates how a fan unit 60 may be coupled to the chassis 50 using clip-like fasteners 26. Specifically, FIG. 4 illustrates an exploded view 56 of the fan unit 60 and the chassis 50 and an assembled view 58 of the fan unit 60 and the chassis 50. The fan unit 60 may be used to force air to flow through the heat sink 27, thereby enabling the heat sink 27 to dissipate heat emitted from the power semiconductor device more efficiently. In one embodiment, the fan unit 60 may include clip-like fasteners 26 that may couple to edges 62 of the chassis 50. The edges 62 may be curved or shaped such that the horizontal edge 32 of the clip-like fastener 26 may fit within the edge 62 and the fan unit 60 may be securely fastened to the chassis 50. For the same reasons listed above, by using the clip-like fasteners 26 and the edge 62 to hold the fan unit 60 in place, the manufacturing process associated with the industrial automation drive 10 may become more efficient and the time associated with manufacturing the industrial automation drive 10 may be reduced significantly.

To contain electric and magnetic fields associated with the power semiconductor device in the power circuit board 22, a voltage barrier 70 (FIG. 5) may be placed above the power circuit board 22 to prevent the electric and magnetic fields associated with the high voltage potentials of the power semiconductor devices from interfering with the operation of the industrial automation drive 10. Additionally, the voltage barrier 70 may prevent an individual from making physical contact with high voltage areas of the power circuit board 22 during drive service. Moreover, the voltage barrier 70 may also provide landing or coupling locations for a back plane board and the like, which may provide connections ports for various other components. Referring now to FIG. 5, the voltage barrier 70 may slide into the chassis 50 using coupling features (e.g., dimples 52) on the chassis 50 and corresponding coupling features (e.g., channel 54) on the voltage barrier 70 as illustrated by exploded view 72 of the voltage barrier 70 and the chassis 50 and assembled view 74 of the voltage barrier 70 and the chassis 50. The dimples 52 and the channel 54 associated with the voltage barrier 70 are similar to the dimples 52 and the channel 54 described with reference to the carrier frame 24.

Like the carrier frame 24 discussed above, in other embodiments, grooves or channels may be formed within the chassis 50 (instead of the dimples 52) and corresponding extensions (instead of the channel 54) from the voltage barrier 70 may couple with the grooves. Also like the carrier frame 24 discussed above, by using the dimples 52 and the channel 54 to hold the voltage barrier 70 in place, the manufacturing process associated with the industrial automation drive 10 may become more efficient and the time associated with manufacturing the industrial automation drive 10 may be reduced significantly.

After securing the voltage barrier 70 to the chassis 50, a backplane board 80 may be attached to the voltage barrier 70, as illustrated by exploded view 76 of the backplane board 80 and the chassis 50 and assembled view 78 of the backplane board 80 and the chassis 50 in FIG. 6. The backplane board 80 may include a number of electronic interface slots that may be coupled to various circuit boards. In certain embodiments, the backplane board 80 may include a number of slots, which may allow option cards or other electronic components to be installed onto the industrial automation drive 10, thereby expanding the features and capabilities of the drive. One of the slots in the backplane board 80 may be coupled to a control board 82, which may control the operation of the industrial automation drive 10. In one embodiment, the backplane board 80 may be secured to the voltage barrier 70 using a generally annular clip-like fastener 84 disposed on the voltage barrier 70. The annular clip-like fastener 84 may include two semi-annular pieces 86 that may bend towards each other when a hole 92 disposed on the backplane board 80 is pressed onto the two semi-annular pieces 86. Each semi-annular piece 86 may include an angled edge 88 and a horizontal edge 90. In one embodiment, the angled edge 88 may be angled to form a spherical shape.

When coupling the backplane board 80 to the voltage barrier 70, the hole 92 of the backplane board 80 may be pressed against the angled edges 88, thereby causing the angled edges 88 to bend towards each other until the hole 92 is pushed past the horizontal edge 90 of the annular clip-like fastener 84. As a result, the backplane board 80 may be coupled to the voltage barrier 70 without the use of tools. Further, the time associated with manufacturing the industrial automation drive 10 may be reduced significantly because screws are not involved with coupling the backplane board 80 to the voltage barrier 70.

Although the voltage barrier 70 had been described as having one annular clip-like fastener 84, in certain embodiments the voltage barrier 70 may include multiple annular clip-like fasteners 84 that may couple to multiple holes disposed on the backplane board 80. Moreover, although the voltage barrier 70 has been described as having annular clip-like fasteners 84, in certain embodiments, the voltage barrier 70 may instead use non-annular clip-like fasteners 26, as described above.

FIG. 7 illustrates exploded view 94 of an upper chassis 100 and the chassis 50, assembled view 96 of the upper chassis 100 and the chassis 50, and operating view 98 of the upper chassis 100. Keeping this in mind, after securing various components in the chassis 50 as described above, the upper chassis 100 may be secured to the chassis 50 using mounting holes (102 and 104) and mounting protrusions (106 and 108). In one embodiment, the upper chassis 100 may be composed of a malleable material (e.g., plastic) and may be secured to the chassis 50 by placing the mounting holes (102 and 104) into the mounting protrusions (106 and 108). The mounting protrusions (106 and 108) may be parts of the chassis 50 that may be shaped to fit inside the mounting holes (102 and 104).

For instance, mounting protrusion 106 may be shaped as a circle and may fit within the mounting hole 102. When the upper chassis 100 is being coupled to the chassis 50, the upper chassis 100 may be aligned above the chassis 50 such that the mounting hole 102 and the mounting protrusion 106 may be aligned along the same vertical axis 110. After the mounting holes 102 and the mounting protrusions 106 are aligned along the vertical axis 110, the upper chassis 100 may be pushed into the chassis 50. Since the upper chassis 100 may be composed of a malleable type of material, the upper chassis 100 may bend outward until the mounting protrusions 106 fit within the mounting holes 102.

In the same manner, the mounting holes 104 may be aligned along a vertical axis 112 and the upper chassis 100 may be pushed into the chassis 50 such that the upper chassis 100 may bend outward until the mounting protrusions 108 fit within the mounting holes 104. As such, the upper chassis 100 may bend outwards until the mounting protrusions 108 fit within the mounting holes 104. In one embodiment, each mounting protrusion 108 may include an angled edge 109 and a horizontal edge 111. In this manner, when a portion of the upper chassis 100 having the mounting hole 104 is pressed against the angled edge 109, the portion of the upper chassis 100 may bend back until the angled edge 109 fits within the mounting hole 104. Once the mounting protrusions (106 and 108) fit within their respective mounting holes (102 and 104), the mounting holes 104 may be disengaged from the mounting protrusions 108 by bending the portions of the upper chassis 100 where the mounting holes 104 are located back until the portions of the upper chassis 100 may be lifted past the mounting protrusions 108. In this manner, the upper chassis 100 may be released from being coupled to the chassis 50. When assembled, as the upper chassis 100 is lifted up, the upper chassis 100 may rotate via mounting holes 102 along axis 114. In certain embodiments, the upper chassis 100 may include protrusions 116 that may fit within slots 118 once the upper chassis 100 has rotated by some angle. When the protrusions 116 fit within the slots 118, the upper chassis 100 may be free-standing and fixed in an upright position, thereby providing access to the components stored within the chassis 50.

While only certain features have been illustrated and described herein, many modifications and changes will occur to those skilled in the art. It is, therefore, to be understood that the appended claims are intended to cover all such modifications and changes.

The invention claimed is:

1. An industrial automation drive, comprising:
   a chassis providing an external framework for the industrial automation drive;
   a carrier frame configured to hold one or more semiconductor devices for use in the industrial automation drive, wherein the carrier frame comprises:
      a first set of fasteners disposed around an internal wall of the carrier frame,
         wherein each fastener of the first set of fasteners comprises:
            an angled edge configured to be pressed against an edge of a power circuit board having the semiconductor devices;
            a horizontal edge adjacent to the angled edge, and
            a vertical edge that is bent outward in a direction away from a center of the carrier frame by the edge of the power circuit board being pressed against the angled edge, wherein the vertical edge is configured to be perpendicular to a primary plane of the power circuit board before the edge of the power circuit board is pressed against the angled edge and after the edge of the power circuit board is pushed passed the horizontal edge;

a second set of fasteners configured to toollessly couple to a set of channels in the chassis by slidably engaging a set of fastening features with the set of channels, wherein the set of channels is configured to slidably receive the set of fastening features;

a voltage barrier configured to toollessly couple to an additional set of channels in the chassis by sliding a corresponding set of channels disposed on two sides of the voltage barrier into the additional set of channels; and a backplane board configured to toollessly couple to the voltage barrier using at least one fastener disposed on the voltage barrier, wherein the at least one fastener comprises two semi-annular pieces, wherein each semi-annular piece comprises an angled edge and horizontal edge, and wherein the backplane board is toollessly coupled to the voltage barrier by pushing a hole disposed on the backplane board onto the angled edge of each semi-annular piece until the backplane board is pushed past the horizontal edge of each semi-annular piece.

2. The industrial automation drive of claim 1, wherein a third set of fasteners disposed underneath the carrier frame is configured to toollessly couple to two or more channels of a heat sink.

3. The industrial automation drive of claim 1, comprising:
an upper chassis configured to couple to the chassis via two annular holes disposed on the upper chassis,
wherein the two annular holes are configured to couple to two annular protrusions extending from a wall of the chassis, and
wherein the upper chassis is configured to cover an open portion of the chassis.

4. A method of manufacturing an industrial automation drive, comprising:
toollessly coupling a power circuit board having one or more semiconductor devices for use in the industrial automation drive to a carrier frame by pushing the power circuit board against a plurality of angled edges of a first plurality of fasteners disposed along an inner wall of the carrier frame until the power circuit board is pushed past the plurality of angled edges, wherein pushing the power circuit board against the plurality of angled edges comprises:

bending a plurality of vertical edges of the first plurality of fasteners outward in a direction away from a center of the carrier frame by the edge of the power circuit board being pressed against the plurality of angled edges, such that the plurality of vertical edges are configured to be disposed perpendicular to a primary plane of the board circuit board before an edge of the power circuit board is pressed against the plurality of angled edges and after the edge of the power circuit board is pushed passed a plurality of horizontal edges disposed adjacent to the plurality of angled edges;

sliding the carrier frame coupled to the power circuit board into a chassis of the industrial automation drive, wherein the carrier frame slides into the chassis by slidably engaging a set of fasteners disposed on two sides of the carrier frame into a corresponding set of channels disposed inside a wall of the chassis;

sliding a voltage barrier into the chassis by slidably engaging a second set of fasteners disposed on two sides of the voltage barrier into a second corresponding set of channels disposed inside the wall of the chassis; and toollessly coupling a backplane board to the voltage barrier by pushing a hole disposed on the backplane board onto two semi-annular angled edges of a fastener until the backplane board is pushed past the two semi-annular angled edges.

5. The method of claim 4, comprising toollessly coupling a fan unit to the chassis by pushing a second plurality of fasteners disposed on two sides of the fan unit against two edges of the chassis until an angled edge of each fastener in the second plurality of fasteners is pushed past the two edges.

6. The method of claim 4, comprising toollessly coupling an upper chassis to the chassis by pushing the upper chassis onto the chassis until two annular holes disposed on the upper chassis fit within two annular protrusions extending out from the wall of the chassis.

7. The method of claim 4, comprising toollessly coupling an upper chassis to the chassis by pushing the upper chassis onto the chassis until two holes disposed on the upper chassis fit within two angled protrusions extending out from the wall of the chassis.

* * * * *